(12) United States Patent
Shin et al.

(10) Patent No.: US 11,237,121 B2
(45) Date of Patent: Feb. 1, 2022

(54) ELECTRON MICROSCOPE, AND METHOD FOR OBSERVING MEASUREMENT SAMPLE

(71) Applicant: The University of Tokyo, Tokyo (JP)

(72) Inventors: Shik Shin, Tokyo (JP); Toshiyuki Taniuchi, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 16/970,862

(22) PCT Filed: Feb. 18, 2019

(86) PCT No.: PCT/JP2019/005874
§ 371 (c)(1),
(2) Date: Oct. 15, 2020

(87) PCT Pub. No.: WO2019/163715
PCT Pub. Date: Aug. 29, 2019

(65) Prior Publication Data
US 2021/0140901 A1 May 13, 2021

(30) Foreign Application Priority Data

Feb. 23, 2018 (JP) .............................. JP2018-031379

(51) Int. Cl.
*G01N 23/227* (2018.01)
*H01J 37/05* (2006.01)
(Continued)

(52) U.S. Cl.
CPC ............ *G01N 23/227* (2013.01); *H01J 37/05* (2013.01); *H01J 37/10* (2013.01); *H01J 37/226* (2013.01);
(Continued)

(58) Field of Classification Search
CPC ........ G01N 23/227; H01J 37/05; H01J 37/10; H01J 37/226; H01J 37/244; H01J 37/26;
(Continued)

(56) References Cited

U.S. PATENT DOCUMENTS

| 2011/0220792 A1* | 9/2011 | Zewail | H01J 37/28 250/307 |
| 2015/0076350 A1* | 3/2015 | Plettner | H01J 37/244 250/336.1 |
| 2021/0140901 A1* | 5/2021 | Shin | H01J 37/244 |

FOREIGN PATENT DOCUMENTS

| JP | H02144844 A | 6/1990 |
| JP | H7-325052 A | 12/1995 |

(Continued)

OTHER PUBLICATIONS

Taniuchi, et al., "Ultrahigh-spatial-resolution chemical and magnetic imaging by laser-based photoemission electron microscopy", Review of Scientific Instruments, 2015, vol. 86, 023701.
(Continued)

*Primary Examiner* — David A Vanore
(74) *Attorney, Agent, or Firm* — Fox Rothschild LLP; Robert J. Sacco; Carol E. Thorstad-Forsyth

(57) ABSTRACT

An electron microscope includes: a laser light source configured to generate a CW laser; an irradiation lens system configured to irradiate a measurement sample with the CW laser; an energy analyzer configured to disperse, depending on energy, photoelectrons emitted from the measurement sample by irradiation with the CW laser; an energy slit configured to allow a photoelectron with a specified energy to pass, among the photoelectrons; an electron beam detector configured to detect the photoelectron passed through the energy slit; a first electron lens system configured to focus the photoelectrons emitted from the measurement sample onto the energy analyzer; and a second electron lens system (Continued)

configured to project the photoelectron passed through the energy slit onto the electron beam detector.

9 Claims, 5 Drawing Sheets

(51) Int. Cl.
   *H01J 37/10* (2006.01)
   *H01J 37/22* (2006.01)
   *H01J 37/244* (2006.01)
   *H01J 37/26* (2006.01)
(52) U.S. Cl.
   CPC ............. *H01J 37/244* (2013.01); *H01J 37/26* (2013.01); *H01J 2237/2448* (2013.01); *H01J 2237/24585* (2013.01)
(58) Field of Classification Search
   CPC ..... H01J 2237/2448; H01J 2237/24585; H01J 37/20; G02B 21/00
   See application file for complete search history.

(56) References Cited

FOREIGN PATENT DOCUMENTS

| JP | 2005-512339 A | 4/2005 |
|---|---|---|
| JP | 2011096714 A | 5/2011 |

OTHER PUBLICATIONS

Goel et al., "A Proposed new scheme for vibronically resolved time-dependent photoelectron spectroscopy: pump-repump-continuous wavephotoelectron spectroscopy (prp-cw-pes)", Physical Chemistry Chemical Physics, 2016, vol. 18, pp. 11263-11277.
Kiss et al., "Laser Excited Ultrahigh Resolution Photoemission Spectroscopy", Hyomen Kagaku. Institute for Solid State Physics, University of Tokyo, 2005, vol. 26, No. 12, pp. 716-720.
International Search Report issued in PCT/JP2019/005874 dated May 7, 2019.
Fangzhun Guo et al: "Introduction of photoemission electron microscopes at SPring-8 for nanotechnology support; Introduction of photoemission electron microscopes at SPring-8 for nanotechnology support", Journal of Physics: Condensed Matter, Institute of Physics Publishing, Bristol, GB, vol. 17, No. 16, Apr. 27, 2005 (Apr. 27, 2005).
Buckanie N M et al: "Space charge effects in photoemission electron microscopy using amplified femtosecond laser pulses", Journal of Physics: Condensed Matter, Institute of Physics Publishing, Bristol, GB, vol. 21, No. 31, Aug. 5, 2009 (Aug. 5, 2009).
Fleming A et al: "Atomic force microscopy and photoemission electron microscopy study of the low-pressure oxidation of transition metal nitrides", Journal of Applied Physics, American Institute of Physics, US, vol. 102, No. 8, Oct. 17, 2007 (Oct. 17, 2007).
Supplemental European Search Report issued in European Patent Application No. 19757961.8 dated Oct. 20, 2021.

* cited by examiner

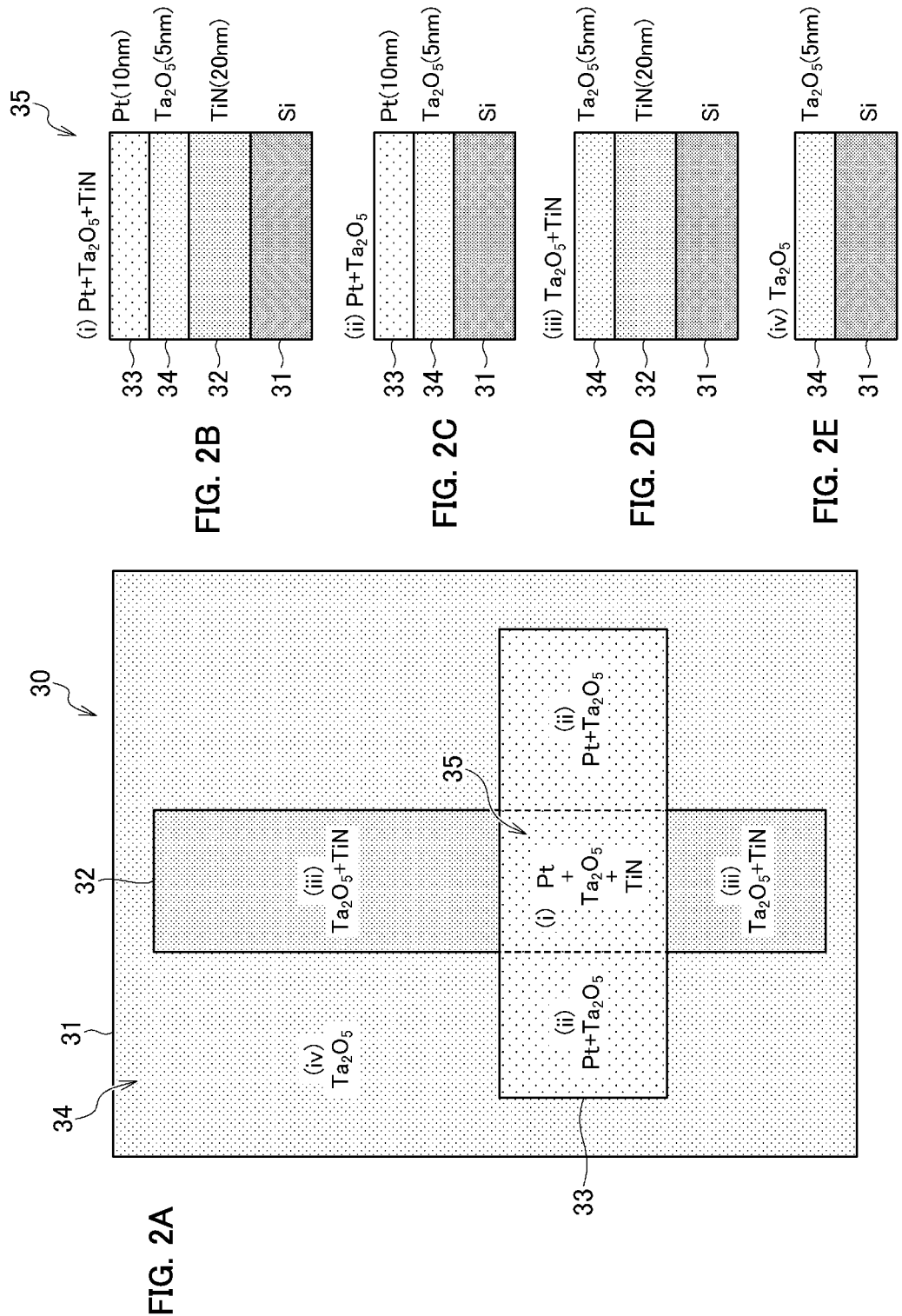

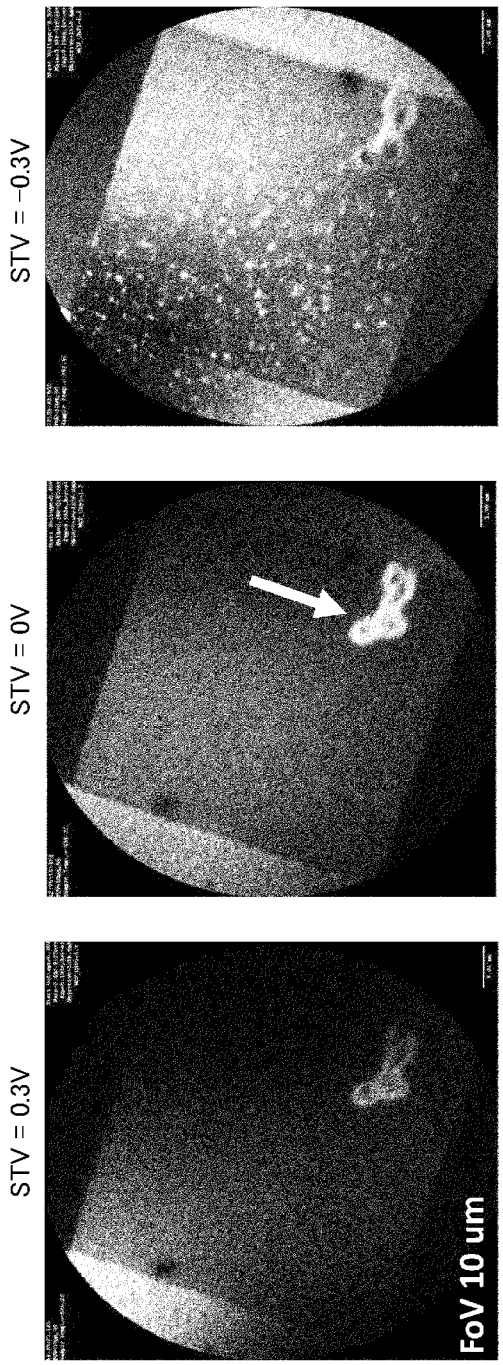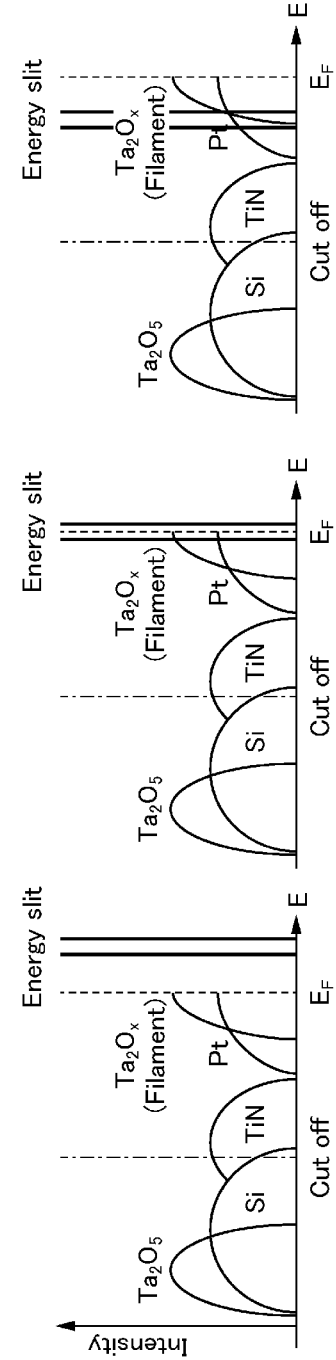
FIG. 3A  FIG. 3B  FIG. 3C

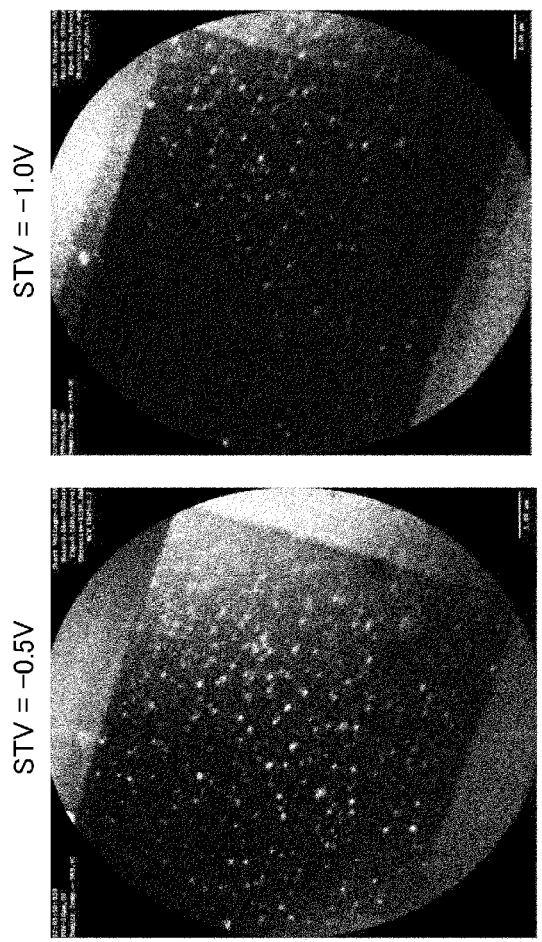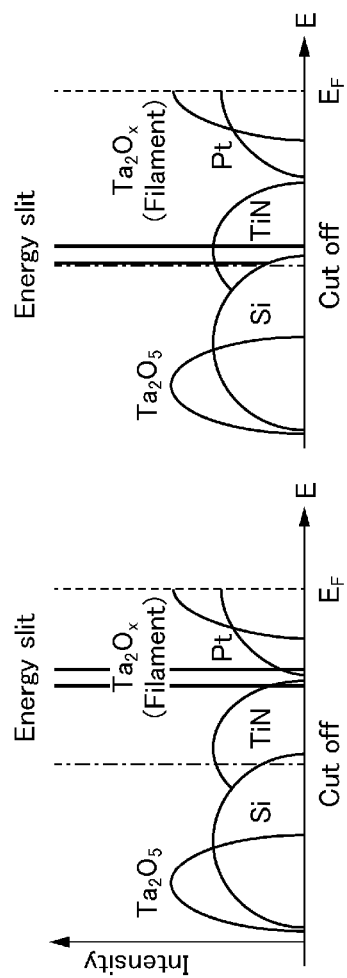
FIG. 3D
FIG. 3E

ELECTRON MICROSCOPE, AND METHOD FOR OBSERVING MEASUREMENT SAMPLE

CROSS REFERENCE TO RELATED APPLICATIONS

This application is a U.S. National Stage entry under 35 U.S.C. § 371 based on International Application No. PCT/JP2019/005874, filed on Feb. 18, 2019, and which claims priority to Japanese Patent Application No. 2018-031379, filed on Feb. 23, 2018, both of which are hereby incorporated herein by reference in their entireties.

TECHNICAL FIELD

The present invention relates to an electron microscope and a method for observing a measurement sample.

BACKGROUND ART

Resistive random access memories have attracted much attention as next-generation memories (see Patent Literature 1). A resistance variable element used for the resistive random access memory has a structure in which an oxide layer such as a transition metal oxide is sandwiched between a lower electrode and an upper electrode. In a set process, by applying a voltage, a conductive path (filament) is formed in the oxide layer, resulting in a low resistance state. In a reset process, by applying an adjusted voltage, the conductive path in a resistance variable layer is broken, resulting in a high resistance state.

In the set process, it is believed that reduction occurs due to the voltage applied to the oxide layer to convert a metal oxide to the metal. This creates a filament to form a current path, resulting in decreasing a resistance value. In the reset process, it is believed that, by further increasing the current, the reduced metal is oxidized by the Joule heat, and the filament disappears, resulting in increasing the resistance again. For example, assuming that the low resistance state represents data "0" and the high resistance state represents data "1," the resistance variable element can be used as a memory to repeatedly store "0" and "1" by repeatedly switching between the two resistance states.

CITATION LIST

Patent Literature

Patent Literature 1: Japanese Laid-Open Patent Publication No. 2011-096714

SUMMARY OF INVENTION

Technical Problem

As for an element having a multilayer structure such as a resistance variable element, in order to observe an oxide layer provided below an upper electrode, there is a need to remove the upper electrode or cut the element to expose the oxide layer from the cutting surface for transmission electron microscope (TEM) observation, for example. That is, the observation cannot be carried out unless the element is destructed.

In view of the foregoing, an object of the invention is to provide an electron microscope and a method for observing a measurement sample, which enable non-destructive observation.

Solution to Problem

An electron microscope according to the invention includes: a laser light source configured to generate a CW laser; an irradiation lens system configured to irradiate a measurement sample with the CW laser; an energy analyzer configured to disperse, depending on energy, photoelectrons emitted from the measurement sample by irradiation with the CW laser; an energy slit configured to allow a photoelectron with a specified energy to pass, among the photoelectrons; an electron beam detector configured to detect the photoelectron passed through the energy slit; a first electron lens system configured to focus the photoelectrons emitted from the measurement sample onto the energy analyzer; and a second electron lens system configured to project the photoelectron passed through the energy slit onto the electron beam detector.

A method for observing a measurement sample according to the invention includes: an irradiating step of irradiating the measurement sample with a CW laser generated by a laser light source; a focusing step of focusing photoelectrons emitted from the measurement sample by irradiation with the CW laser onto an energy analyzer; a dispersing step of dispersing the photoelectrons depending on energy, using the energy analyzer; a selecting step of irradiating an energy slit with the photoelectrons dispersed to select a photoelectron with a specified energy among the photoelectrons; a projecting step of projecting the photoelectron passed through the energy slit onto an electron beam detector; and a detecting step of detecting the photoelectron projected onto the electron beam detector.

Advantageous Effects of Invention

According to the invention, since an energy slit allows a photoelectron with a specified energy to pass, and an electron beam detector detects the photoelectron passed through the energy slit, it is possible to select an energy of an electron to be detected by the electron beam detector and selectively observe a specific material. This makes it possible to observe a specific material existing below an outermost layer of a measurement sample without destructing the measurement sample, thereby enabling non-destructive observation.

BRIEF DESCRIPTION OF DRAWINGS

FIG. 2A is a schematic view of an overall configuration of a measurement sample according to the embodiment of the invention, FIG. 2B is a schematic view of a cross section of a region (i), FIG. 2C is a schematic view of a cross section of a region (ii), FIG. 2D is a schematic view of a cross section of a region (iii), and FIG. 2E is a schematic view of a cross section of a region (iv).

FIG. 3A is an image of a joint portion when STV is set at 0.3 V, FIG. 3B is an image of the joint portion when STV is set at 0 V, and FIG. 3C is an image of the joint portion when STV is set at −0.3 V.

FIG. 3D is an image of the joint portion when STV is set at −0.5 V, and FIG. 3E is an image of the joint portion when STV is set at −1.0 V.

DESCRIPTION OF EMBODIMENTS

Figure 1:
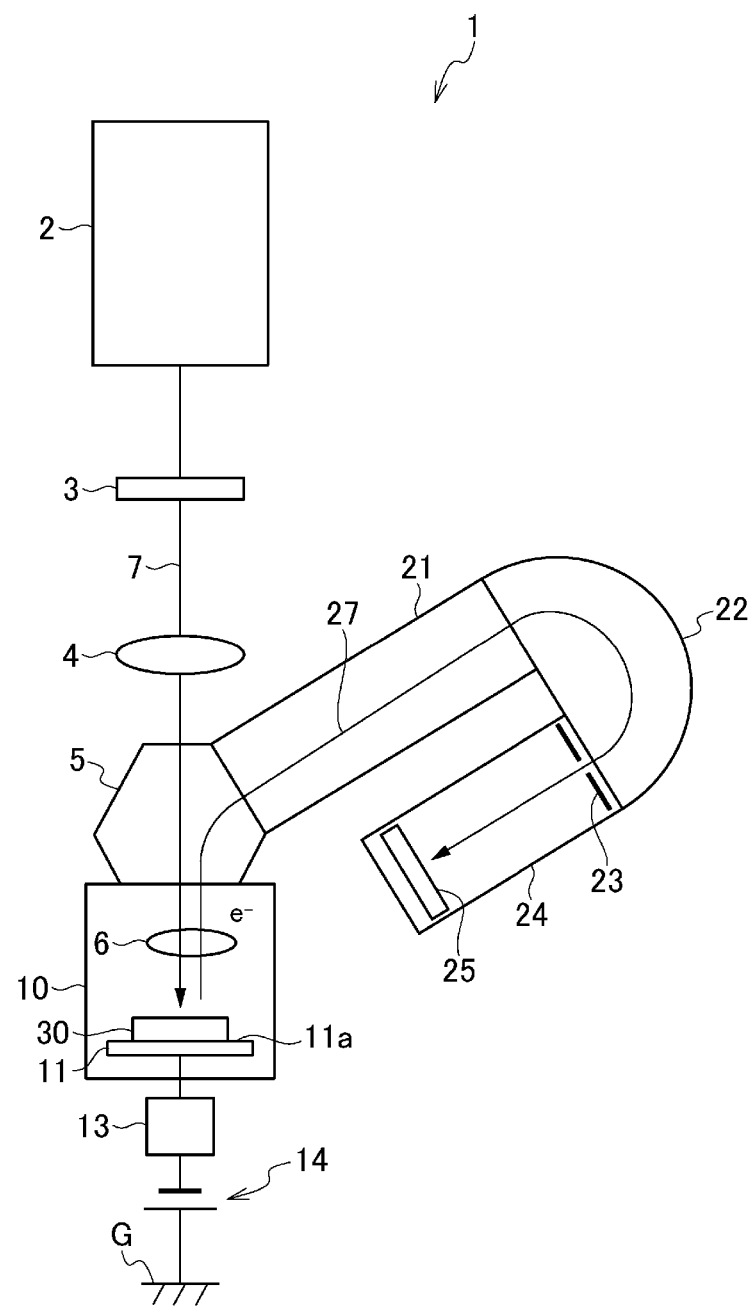
FIG. 1 is a schematic view of an overall configuration of an electron microscope according to an embodiment of the invention.

(1) Overall Configuration of Electron Microscope According to Embodiments of the Invention An electron microscope of the embodiment is a laser photoemission electron microscope for detecting photoelectrons emitted from a measurement sample to observe the measurement sample. As shown in FIG. 1, an electron microscope 1 of the embodiment includes a laser light source 2, a wavelength plate 3, an irradiation lens system including a focusing lens 4 and an objective lens 6, a beam separator 5, a chamber 10, an energy adjusting mechanism 13, a power source 14, a first electron lens system 21, an energy analyzer 22, an energy slit 23, a second electron lens system 24, and an electron beam detector 25.

The laser light source 2 is a laser oscillator for generating a continuous wave (CW) laser 7. The wavelength of the CW laser 7 is selected such that energy hv of the CW laser 7 is higher than a work function $\phi$ of a measurement sample 30, so that photoelectrons are emitted from the measurement sample 30 by irradiation with the CW laser 7. More specifically, the wavelength of the CW laser 7 is set to be higher than the work function $\phi$ of a material forming an outermost layer of an observation region of the measurement sample 30. In the embodiment, the laser light source 2 generates the CW laser 7 having a wavelength of 266 nm (energy hv=4.66 eV). The wavelength plate 3 is an element for switching polarization of the CW laser 7 between linear polarization and right/left circular polarization. In general, the CW laser 7 is linearly polarized by the wavelength plate 3; however, in order to measure magnetic characteristics of the measurement sample 30 using magnetic circular dichroism, the CW laser 7 is right and left circularly polarized by the wavelength plate 3.

In the irradiation lens system, the focusing lens 4 focuses the CW laser 7 onto the objective lens 6, and the objective lens 6 focuses the CW laser 7 onto a surface of the measurement sample 30 to irradiate the measurement sample 30 with the CW laser 7. The objective lens 6 is arranged such that the focus position is near the surface of the measurement sample 30. The focusing lens 4 and the objective lens 6 are known lenses, and can be appropriately selected according to a size of the irradiation region of the CW laser 7, that is, the size of the observation region of the measurement sample 30.

The chamber 10 has a highly airtight structure, and a vacuum pump such as a turbo-molecular pump which is not shown in the drawings is connected to the chamber 10. The internal space of the chamber 10 is set to a predetermined degree of vacuum ($1.0 \times 10^{-5}$ to $10^{-8}$ Torr) by the vacuum pump. Inside the chamber 10, a stage 11 on which the measurement sample 30 is configured to be placed and the objective lens 6 are disposed. In the embodiment, the chamber 10 and the beam separator 5 are connected to each other, and the objective lens 6 is fixed to the beam separator 5. However, for the sake of convenience, the beam separator 5 and the objective lens 6 are shown separately from each other in FIG. 1. A driving mechanism, which is not shown in the drawings, is connected to the stage 11 to move the stage 11 in three directions orthogonal to each other. In the embodiment, the stage 11 is arranged such that a placement face 11a on which the measurement sample 30 is configured to be placed is orthogonal to the optical axis of the CW laser 7.

The measurement sample 30 is placed on the placement face 11a of the stage 11 in the chamber 10, and the CW laser 7 is perpendicularly incident on the surface of the measurement sample 30. Here, the measurement sample 30 of the embodiment will be described with reference to FIGS. 2A to 2E. As shown in FIG. 2A, the measurement sample 30 is a resistance variable element including a lower electrode 32 on a Si substrate 31, an oxide layer 34 on the lower electrode 32, and an upper electrode 33 on the oxide layer 34. In the measurement sample 30, the upper electrode 33 and the lower electrode 32, both of which are rectangular in shape, are arranged such that longitudinal directions of the upper electrode 33 and the lower electrode 32 are orthogonal to each other to provide a quadrilateral joint portion 35.

As shown in FIG. 2B, the joint portion 35 (region (i) shown in FIG. 2A) has a three-layer structure of the lower electrode 32, the oxide layer 34, and the upper electrode 33, on the Si substrate 31. The lower electrode 32 is made of TiN (titanium nitride), the oxide layer 34 is made of $Ta_2O_5$ (tantalum pentoxide), and the upper electrode 33 is made of Pt (platinum). When a voltage is applied between the upper electrode 33 and the lower electrode 32 of the measurement sample 30, $Ta_2O_5$ in the oxide layer 34 of the joint portion 35 is reduced to form a filament made of $Ta_2O_x$. The filament provides a conductive path between the upper electrode 33 and the lower electrode 32, thus the measurement sample 30 is in a low resistance state. In the embodiment, the thicknesses of the lower electrode 32, the oxide layer 34, and the upper electrode 33 are 20 nm, 5 nm, and 10 nm, respectively, and the area of the joint portion 35 is approximately 25 $\mu m^2$.

Such a resistance variable element may be manufactured as follows, for example. First, the Si substrate 31 is prepared, and the rectangular lower electrode 32 is formed on the Si substrate 31 by sputtering using a mask formed by photolithography. Next, the mask is removed, and the oxide layer 34 is formed by sputtering on the entire surface of the Si substrate 31 on which the lower electrode 32 is formed. Finally, a mask is formed on the oxide layer 34 by photolithography, and the rectangular upper electrode 33 is formed by sputtering such that the long axis of the upper electrode 33 is orthogonal to the long axis of the lower electrode 32.

With the process above, in the region of the upper electrode 33 other than the joint portion 35 (region (ii) shown in FIG. 2A), a two-layer structure of the oxide layer 34 and the upper electrode 33 is formed on the Si substrate 31 as shown in FIG. 2C. In the region of the lower electrode 32 other than the joint portion 35 (region (iii) shown in FIG. 2A), a two-layer structure of the lower electrode 32 and the oxide layer 34 is formed on the Si substrate 31 as shown in FIG. 2D. In the region (iii) shown in FIG. 2A, the oxide layer 34 formed on the lower electrode 32 is not shown for the sake of convenience. In the region of the Si substrate 31 where the resistance variable element is not formed (region (iv) shown in FIG. 2A), the oxide layer 34 is formed on the Si substrate 31 as shown in FIG. 2E.

The surface of such a measurement sample 30 is irradiated with the CW laser 7. In the embodiment, an irradiation optical system is adjusted such that the entire joint portion 35 is irradiated with the CW laser 7, which makes it possible to observe the entire joint portion 35 at one time. As described above, since the wavelength of the CW laser 7 is selected such that the energy hv of the CW laser 7 is higher than the work function $\phi$ of the outermost layer (Pt in the embodiment) of the measurement sample 30, when the measurement sample 30 is irradiated with the CW laser 7, the photoelectric effect occurs, and electrons of the measurement sample 30, that is, the upper electrode 33, the oxide layer 34, and the lower electrode 32, are excited to emit photoelectrons from the measurement sample 30. A large number of photoelectrons are emitted from the region irradiated with the CW laser 7, and the photoelectrons enter the beam separator 5. In the description, the emitted large number of photoelectrons are collectively referred to as electron beams 27.

Here, although the wavelength of the CW laser 7 may be selected according to the work function $\phi$ of the outermost layer of the measurement sample 30 as described above, the wavelength is preferably 266 nm or less, and more preferably 213 nm or less. By selecting the wavelength in this manner, it also becomes possible to measure a sample having a larger work function (1), and the versatility is improved. The difference between the energy hv of the CW laser 7 and the work function $\phi$ of the outermost layer of the measurement sample 30 is denoted by $\Delta E$ (=hv−$\phi$). It is preferable to select the wavelength of the CW laser 7 such that $\Delta E$ is in a range of 0.0 eV to 0.5 eV. By selecting the wavelength of the CW laser 7 in this way, it is possible to observe a material at a deep position (such as the oxide layer 34 existing under the upper electrode 33) with high resolution. This is because as the energy of the photoelectrons becomes smaller, the photoelectrons are more sensitive to the energy barrier when released from the surface of the sample, which causes obliquely emitted photoelectrons to favor total reflection on the surface, resulting in forming an image only with substantially perpendicularly emitted photoelectrons. For example, this is advantageous when observing the filament formed in the oxide layer 34 below the upper electrode 33, which is the outermost layer of the measurement sample 30 having a multilayer structure. In order to measure $\Delta E$, a desirable measurement position in the measurement sample 30 is measured using a laser photoemission electron microscope, and an electron energy distribution of the desirable measurement position is obtained using an energy analyzer. $\Delta E$ is obtained from the electron energy distribution. $\Delta E$ is equivalent to a width of a band structure in the electron energy distribution (from a cutoff to Fermi level $E_F$, which will be described later).

The electron microscope 1 further includes a power source 14 whose negative terminal is connected to the stage 11 and whose positive terminal is connected to ground G, so as to apply a negative voltage to the measurement sample 30. The power source 14 is a general power source capable of outputting a high voltage. In the embodiment, a voltage of −20 kV is applied to the measurement sample 30 by the power source 14. As a result, an electric field is generated between the measurement sample 30 and the beam separator 5 to which no voltage is applied. This electric field facilitates the emission of photoelectrons from the measurement sample 30, and accelerates the emitted photoelectrons toward the beam separator 5 so that the electron beams 27 can be attracted to the beam separator 5.

The electron microscope 1 includes an energy adjusting mechanism 13 between the power source 14 and the stage 11. The energy adjusting mechanism 13 is a power source configured to output a specified voltage STV. The energy adjusting mechanism 13 and the power source 14 are connected in series so that a total voltage of STV and the output voltage of the power source 14 can be applied to the measurement sample 30. The energy adjusting mechanism 13 can adjust energy Ep of the photoelectrons emitted from the measurement sample 30 by adjusting the value of STV. The kinetic energy of the photoelectrons is denoted by Ek. In the embodiment, the energy Ep of the photoelectrons is given by Ep=20 kV+Ek−STV. The kinetic energy Ek of the photoelectrons is generated by excitation of electrons in the measurement sample 30 irradiated with the CW laser 7, and changes depending on energy E of electrons in a material. Therefore, the energy Ep of the photoelectrons also depends on the energy E of the electrons in the material.

When the electron beams 27 are incident, the beam separator 5 deflects the electron beams 27 to separate the path of the electron beams 27 from the path of the CW laser 7. The beam separator 5 has an exit opening connected to the first electron lens system 21 to cause the deflected electron beams 27 to enter the first electron lens system 21. The first electron lens system 21 includes a plurality of electron lenses to focus the incident electron beams 27. The first electron lens system 21 has an one end connected to the beam separator 5 and has the other end connected to the energy analyzer 22 to focus the electron beams 27 onto the energy analyzer 22 and cause the electron beams 27 to enter the energy analyzer 22.

The energy analyzer 22 is a known energy analyzer. The energy analyzer 22 disperses the incident electron beams 27 according to energy Ep of photoelectrons and outputs the electron beams 27 dispersed according to energy Ep. The energy analyzer 22 has a hemispherical shape with two flat portions on which an incident opening and an exit opening for beams are respectively provided. The energy analyzer 22 has the incident opening connected to the first electron lens system 21 and has the exit opening connected to the second electron lens system 24, and disperses the electron beams 27 incident from the first electron lens system 21 according to energy Ep of the photoelectrons and outputs the electron beam 27 to the second electron lens system 24.

The energy slit 23 is provided at the exit opening of the energy analyzer 22. The energy slit 23 is a general slit having a penetrating slot provided linearly in a plate-shaped member. The energy slit 23 allows the electron beam 27 for irradiating the slot to pass, and blocks the electron beams 27 for irradiating the plate-shaped member. In practice, the electron beams 27 for irradiating the plate-shaped member is not completely blocked, and a part of the electron beams 27 also passes through the energy slit 23. Therefore, the energy slit 23 lowers the intensity of the electron beams 27 other than the electron beam 27 for irradiating the slot. In the embodiment, the width of the slot of the energy slit 23 is 40 μm.

Since the energy slit 23 is disposed at the exit opening of the energy analyzer 22, an electron beam 27 passed through the energy slit 23 among the electron beams 27 dispersed by the energy analyzer 22 enters the second electron lens system 24. In this case, since the electron beams 27 are dispersed by the energy analyzer 22 depending on energy Ep of photoelectrons, a passing position of the electron beam 27 in the exit opening is also defined depending on energy Ep of photoelectrons. Therefore, by adjusting the position of the energy slit 23, it is possible to select the energy Ep of the photoelectron to be detected by the electron beam detector 25. The energy Ep of the photoelectrons depends on the energy E of the electrons in a material (in the measurement sample 30). Hence, by changing the position of the energy slit 23, it is possible to select the energy E in the measurement sample 30 and select electrons in the measurement sample 30 to be detected.

Since the energy Ep of the photoelectrons is given by Ep=20 kV+Ek−STV, it is possible to change the energy Ep of the photoelectrons by changing the value of STV. Hence, by changing the value of STV, it is possible to select the energy Ep of the photoelectrons to be detected by the electron beam detector 25 and select the electrons in the measurement sample 30 to be detected.

The second electron lens system 24 includes a plurality of electron lenses to project the incident electron beam 27 onto the electron beam detector 25. The electron beam detector 25 is a two-dimensional photoelectron detector configured to detect a photoelectron of the projected electron beam 27 and generate an image of the measurement sample 30 based on the intensity of the detected photoelectron. Since the electron beam detector 25 generates an image from the projected electron beam 27, it is possible to continuously generate images and generate not only still images but also moving images. The electron beam detector 25 is connected to a PC which is not shown in the drawings, and can send the generated images to the PC to store the images in a storage device of the PC, or to display the images on a monitor of the PC, allowing an operator of the electron microscope 1 to check the images.

Examples of observation of the measurement sample 30 using the electron microscope 1 are shown in FIGS. 3A to 3E. The resistance variable element is in a low resistance state by applying a specified voltage between the upper electrode 33 and the lower electrode 32 in advance to form a filament. Images on the upper side in FIGS. 3A to 3E are obtained by imaging the joint portion 35 with the electron microscope 1, and graphs below these images indicate density of states of the materials contained in the measurement sample 30, in which the horizontal axis represents the energy E of the electrons of the measurement sample 30 and the vertical axis represents the intensity of the electrons (that is, the number of states). In the graphs indicating density of states in FIGS. 3A to 3E, $E_F$ is the Fermi level, and two solid lines indicate a band EB of the energy E of electrons that can pass through the energy slit 23 as photoelectrons. In practice, the band EB shown in FIGS. 3A to 3E means that much more electrons with energy E within the band EB can pass through the energy slit 23, and apart of electrons with energy E outside the band EB can also pass through the energy slit 23. Outside the band EB, electrons with energy E close to the lower limit or the upper limit of the band EB are more likely to pass. In the graphs of density of states, "Cut off" is the energy at which the kinetic energy of the emitted photoelectrons is zero.

FIG. 3A is an image of the joint portion 35 when STV is set at 0.3 V. In the image of FIG. 3A, the boundary between the joint portion 35 and the upper electrode 33 made of Pt is found at the upper left of the image, and it can be found that some structure exists at the lower right of the image. The image has a low luminance value in whole. In this case, as shown in the graph of the density of states in the lower part of FIG. 3A, the band EB of energy E of electrons that can pass through the energy slit 23 as photoelectrons is higher than the Fermi level $E_F$. In the energy E within the band EB, there is no state of material forming the measurement sample 30, and the electrons with energy E within the band EB do not exist in the measurement sample 30. Hence, there are no photoelectrons that easily pass through the energy slit 23, and thus the electron beam detector 25 detects few photoelectrons. As a result, the image has a low luminance value in whole.

FIG. 3B is an image of the joint portion 35 when STV is set at 0 V. As can be seen from the image of FIG. 3B, there is a region having a high luminance value at the lower right of the image (at a position indicated by an arrow in FIG. 3B). This is believed to be due to an increase in the luminance value of the structure observed when STV is 0.3 V. In this case, the band EB is near the Fermi level $E_F$, there are states of Pt and $Ta_2O_x$ (filament) within the band EB, and the electrons with energy E within the band EB exist in Pt and $Ta_2O_x$. On the other hand, there is no state of $Ta_2O_5$ within the band EB, and the electrons with energy E within the band EB do not exist in $Ta_2O_5$. Since the photoelectrons emitted from Pt and $Ta_2O_x$ easily pass through the energy slit 23, the electron beam detector 25 detects a large amount of photoelectrons emitted from Pt and $Ta_2O_x$ while detecting a small amount of photoelectrons emitted from $Ta_2O_5$. As a result, the luminance values of Pt and $Ta_2O_x$ are high in the image while the luminance value of $Ta_2O_5$ is low in the image. Moreover, $Ta_2O_x$ has a higher density of states than that of Pt in the vicinity of the Fermi level $E_F$, and thus a larger number of photoelectrons are emitted from $Ta_2O_x$. Therefore, the electron beam detector 25 detects more photoelectrons emitted from $Ta_2O_x$, and the $Ta_2O_x$ portion has the highest luminance value in the image. Since the observed structure in FIG. 3B has the highest luminance value, the structure is believed to be formed of $Ta_2O_x$ and is regarded as a filament.

As described above, the electron microscope 1 includes the energy slit 23 to select the energy E of electrons to be detected, thus making it possible to selectively observe the filament made of $Ta_2O_x$ from the oxide layer 34 made of $Ta_2O_5$. Moreover, it is possible to observe the filament formed in the oxide layer 34 below the upper electrode 33 and to selectively observe a specific material non-destructively.

The image shown in FIG. 3B has a higher luminance value as a whole compared with the image obtained when STV is 0.3 V. This may be because the photoelectrons emitted from Pt easily pass through the energy slit 23, which increases the luminance value of the region of the upper electrode 33 in the image. The boundary between the upper electrode 33 and the joint portion 35 can be found at the upper left and lower right of the image. Although the lower electrode 32 should exist at the lower left and upper right of the image, electrons emitted from the lower electrode 32 barely pass through the energy slit 23, thus the region of the lower electrode 32 is dark in the image and cannot be found. However, the joint portion 35 and the upper electrode 33 appear brightly, and thus the boundary between the lower electrode 32 and the joint portion 35 can be found.

FIG. 3C is an image of the joint portion 35 when STV is set at −0.3 V. As can be seen from the image of FIG. 3C, the luminance value of the upper electrode 33 region is high. The boundary between the upper electrode 33 and the joint portion 35 can appear more clearly. In addition, it can be found that the luminance value of the filament is reduced. Moreover, a plurality of granular portions can be found in the joint portion 35. In this case, the band EB is on the lower energy side as compared with the case where STV is 0 V, thus there are the states of Pt and $Ta_2O_x$ within the band EB, and the electrons with energy E within the band EB exist in Pt and $Ta_2O_x$. As compared with the case where STV is 0 V, the state of Pt is dominant over the state of $Ta_2O_x$ within the band EB. Hence, Pt has much more electrons with energy E within the band EB than $Ta_2O_x$. As a result, the electron beam detector 25 detects more photoelectrons emitted from Pt than from $Ta_2O_x$, which increases the luminance value of the region of the upper electrode 33 made of Pt in the image and lowers the luminance value of the filament in the image. The granular portions can be found due to an increase in the photoelectrons emitted from Pt, and thus may be regarded as Pt.

FIG. 3D is an image of the joint portion 35 when STV is set at −0.5 V. As can be seen from the image of FIG. 3D, the luminance values of the upper electrode 33 (right side in the image) and the lower electrode 32 (upper part in the image)

are high in the image. In addition, the filament cannot be observed. In this case, the band EB is on the lower energy side as compared with the case where STV is −0.3 V, and there are the states of Pt and TiN within the band EB while the state of $Ta_2O_x$ no longer exists within the band EB. That is, Pt and TiN have electrons with energy E within the band EB, and thus the photoelectrons emitted from Pt and TiN easily pass through the energy slit 23. Pt and TiN share almost the same amount of electrons with energy E within the band EB. It is therefore believed that the luminance values of the upper electrode 33 and the lower electrode 32 are high in the image. In addition, since the state of $Ta_2O_x$ no longer exists within the band EB, it is believed that the photoelectrons emitted from $Ta_2O_x$ is barely detected, and thus the filament cannot be observed.

FIG. 3E is an image of the joint portion 35 when STV is set at −1.0 V. As can be seen from the image of FIG. 3E, the luminance value of the lower electrode 32 (upper part in the image) is high in the image. In this case, the band EB is on the lower energy side as compared with the case where STV is −0.5 V, and there are the states of TiN and Si within the band EB. That is, TiN and Si have electrons with energy E within the band EB, and thus the photoelectrons emitted from TiN and Si easily pass through the energy slit 23. The density of states shows TiN is dominant over Si with respect to the electrons with energy E within the band EB. It is therefore believed that the luminance value of the lower electrode 32 is high in the image.

As described above, by determining STV on the basis of density of states such that the band EB of energy E of electrons that can pass through the energy slit 23 as photoelectrons corresponds to an energy band in which density of states is high for a desired material, it is possible to increase the photoelectrons emitted from the desired material, and easily detect the photoelectrons, which makes it possible to selectively observe the desired material.

According to the above configuration, the electron microscope 1 includes the laser light source 2 configured to generate the CW laser 7, the irradiation lens system (the focusing lens 4 and the objective lens 6) configured to irradiate the measurement sample 30 with the CW laser 7, the energy analyzer 22 configured to disperse, depending on energy Ep, the photoelectrons emitted from the measurement sample 30 by irradiation with the CW laser 7, the energy slit 23 configured to allow a photoelectron with a specified energy Ep to pass, the electron beam detector 25 configured to detect the photoelectron passed through the energy slit 23, the first electron lens system 21 configured to focus the photoelectrons emitted from the measurement sample 30 onto the energy analyzer 22, and the second electron lens system 24 configured to project the photoelectron passed through the energy slit 23 onto the electron beam detector 25.

Since the electron microscope 1 includes the energy slit 23 configured to allow the photoelectron with the specified energy Ep to pass, and the electron beam detector 25 configured to detect the photoelectron passed through the energy slit 23, it is possible to select the energy E of electrons to be detected by the electron beam detector 25 and to selectively observe a specific material. Therefore, the electron microscope 1 makes it possible to observe the filament of the oxide layer 34 existing below the upper electrode 33, which is the outermost layer of the measurement sample 30, without destructing the upper electrode 33, enabling non-destructive observation.

Moreover, the electron microscope 1 includes the second electron lens system 24 configured to project the photoelectron passed through the energy slit 23 onto the electron beam detector 25 for detection, thus making it possible to observe the entire measurement region at one time without scanning and to continuously observe the measurement sample 30. Therefore, when the measurement sample 30 is the resistance variable element as described above, by observing the oxide layer 34 with the electron microscope 1 while applying a voltage between the upper electrode 33 and the lower electrode 32 of the resistance variable element in which no filament is formed, it is possible to observe how the filament is formed.

(2) Other Embodiments

In the above embodiments, the CW laser 7 is perpendicularly incident on the measurement sample 30, and the path of the electron beams 27 formed by the photoelectrons emitted from the measurement sample 30 is separated from the path of the CW laser 7 by the beam separator 5. However, the invention is not limited thereto, and the electron microscope 1 may not include the beam separator 5. For example, in order to emit the photoelectrons perpendicular to the measurement sample 30 for detection, the laser light source 2 is arranged such that the path of the CW laser 7 is oblique at a predetermined angle (such as 45 degrees) with respect to the perpendicular direction of the measurement sample 30 to irradiate the measurement sample 30 with the CW laser 7.

Figure 4:
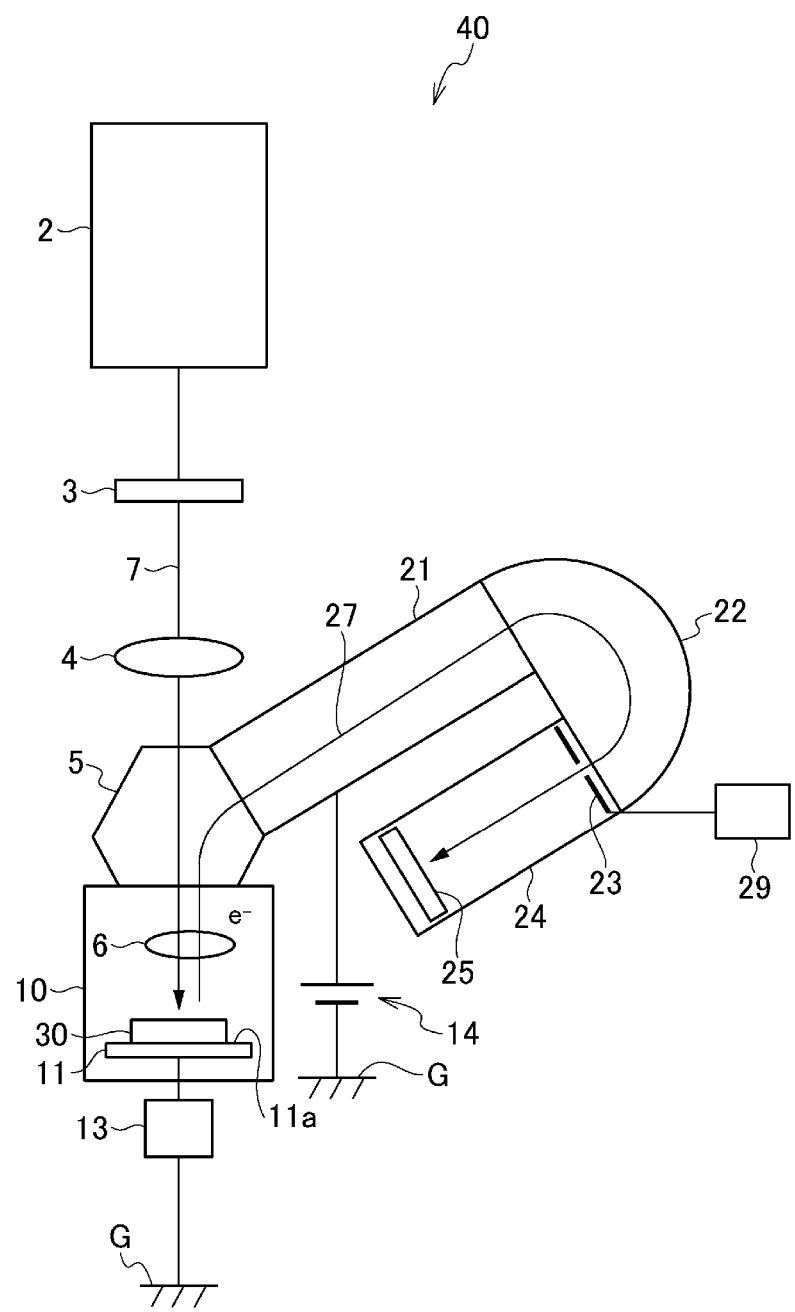
FIG. 4 is a schematic view of an overall configuration of an electron microscope according to another embodiment of the invention.

Moreover, in the above embodiments, the power source 14 is connected to the stage 11, and a negative voltage is applied to the measurement sample 30 to generate an electric field between the measurement sample 30 and the beam separator 5, which facilitates the emission of photoelectrons. However, the invention is not limited thereto. For example, as shown in FIG. 4 in which the same reference signs are used to designate the same components as those in FIG. 1, an electron microscope 40 includes the power source 14 whose positive terminal is connected to the first electron lens system 21 and whose negative terminal is connected to the ground G to apply a positive voltage to the first electron lens system 21. With this configuration, the power source 14 is configured to charge the first electron lens system 21 to a positive voltage to generate an electric field between the measurement sample 30 and the beam separator 5, which facilitates the emission of photoelectrons from the measurement sample 30. In this case, the energy adjusting mechanism 13 is also connected to the ground G. By applying a voltage to the first electron lens system 21 instead of the measurement sample 30, there is no need to apply a voltage to the measurement sample 30 and this is advantageous for industrial use. Also, the power source 14 may be connected to the beam separator 5 to apply a voltage to the beam separator 5.

In the above embodiments, the energy slit 23 is fixed. However, the invention is not limited thereto. As shown in FIG. 4, the electron microscope 40 may include a slit moving mechanism 29 provided to the energy slit 23 to move the position of the energy slit 23 so as to change the band EB of energy of electrons passing through the energy slit 23.

(3) Applications of Electron Microscope

According to the above description, the electron microscope 1 makes it possible to observe the resistance variable element as the measurement sample 30 and observe the filament formed in the oxide layer 34 between the upper electrode 33 and the lower electrode 32 to visualize the resistance state of the resistance variable element. This is because, compared with Pt of the upper electrode and $Ta_2O_5$ of the oxide layer 34, $Ta_2O_x$ of the filament formed in the oxide layer 34 has a higher density of states when the energy of electrons is near the Fermi level, and thus has a higher intensity of photoelectrons detected by the electron beam detector 25. Hence, by providing the energy slit 23 which allows electrons with energy near the Fermi level to pass, it is possible to selectively detect the photoelectrons emitted from $Ta_2O_x$. As described above, the electron microscope 1 makes it possible to selectively observe a material having a higher density of states than that of other materials at a specified electron energy. Utilizing this property, the electron microscope 1 can also be used for other applications.

For example, a resistance state of a phase change element which constitutes a phase change memory (PCM) can be visualized. The phase change element is a memory element that exploits behavior of phase change material, such as chalcogenide alloy, having different resistance values in a crystalline state (low resistance state) and in an amorphous state (high resistance state). In the phase change element, a phase change material layer is sandwiched between an upper electrode and a lower electrode, and the resistance state is changed by the Joule heat generated by applying an electrical current between the upper electrode and the lower electrode. In the phase change material, the work function and the density of states near the Fermi level in the crystalline state are different from those in the amorphous state, which differentiates the amount of emitted photoelectrons between the two states. Therefore, in order to observe the resistance variable element using the electron microscope 1, by setting STV and the energy slit 23 so as to allow electrons with energy near the Fermi level to pass, it is possible to selectively observe the crystalline state and to visualize the change between the crystalline state and the amorphous state. By applying a voltage between the upper electrode and the lower electrode, it is also possible to continuously observe the change between the crystalline state and the amorphous state.

The electron microscope 1 can also be used to evaluate a magnetoresistive element which constitutes a magnetic random access memory. The magnetoresistive element has a three-layer structure of a ferromagnetic layer, an insulating layer, and a ferromagnetic layer. In the magnetoresistive element, one of the ferromagnetic layers serves as a fixed layer in which the magnetization direction is fixed; the other of the ferromagnetic layers serves as a free layer in which the magnetization direction varies depending on an external magnetic field, spin torque, etc. The magnetoresistive element is a memory element which exploits the property that shows low resistance when the magnetization directions of the fixed layer and the free layer are parallel, and shows high resistance when the magnetization directions of the fixed layer and the free layer are anti-parallel.

The electron microscope 1 is capable of visualizing a magnetic domain structure of the free layer (such as Fe epitaxial film) of such a magnetoresistive element. In order to visualize the magnetic domain structure, the electron microscope 1 exploits the property that the amount of photoelectrons emitted from the measurement sample 30 irradiated with a left circularly polarized laser is different from the amount of photoelectrons emitted from the measurement sample 30 irradiated with a right circularly polarized laser, depending on the magnetization direction. Specifically, the wavelength plate 3 switches between the right and left circular polarizations of the CW laser 7 to irradiate the magnetoresistive element as the measurement sample 30, thereby obtaining two observed images for right and left circular polarizations. The difference between the intensities of the two observed images is obtained to extract magnetic information only, thereby visualizing the magnetic domain structure. In this case, since the electron microscope 1 includes the energy slit 23, it is possible to reduce chromatic aberration of electron lenses and perform measurement with high resolution. In this case, the observation can also be carried out even when the free layer is provided below the fixed layer and the insulating layer.

The electron microscope 1 is also capable of detecting defects in the insulating layer of the magnetoresistive element. The defective portion of the insulating layer has a higher density of states near the Fermi level than the non-defective portion of the insulating layer. Therefore, by setting STV and the energy slit 23 so as to allow electrons with energy near the Fermi level to pass, the detection intensity of the photoelectrons emitted from the defective portion of the insulating layer can be higher than that of the photoelectrons emitted from the non-defective portion of the insulating layer, which makes it possible to selectively observe a metal portion in an insulator. Hence, the electron microscope 1 is capable of detecting the defects in the insulating layer of the magnetoresistive element. Further, by observing the magnetoresistive element while applying a voltage to the fixed layer and the free layer of the magnetoresistive element, it is also possible to observe formation of defects due to dielectric breakdown.

The electron microscope 1 can also be used for defect inspection of a capacitor layer of NAND-Flash. In NAND-Flash, a portion with crystal defects has a higher density of states at the Fermi level than other portions. Therefore, by setting STV and the energy slit 23 so as to allow electrons with energy near the Fermi level to pass, the detection intensity of the photoelectrons emitted from the crystal defects can be higher than that of the photoelectrons emitted from the portions without crystal defects, which makes it possible to selectively observe the crystal defects in the capacitor layer. Therefore, the electron microscope 1 is capable of detecting crystal defects in the capacitor layer of NAND-Flash. It is also possible to observe crystal defects in the capacitor layer of NAND-Flash by observing the capacitor layer while applying current to NAND-Flash.

The electron microscope 1 can also be used to inspect structure of a metal mask formed in glass. The metal mask portion in the glass has a higher density of states at the Fermi level than the glass portion. Therefore, by setting STV and the energy slit 23 so as to allow electrons with energy near the Fermi level to pass, the detection intensity of the photoelectrons emitted from the metal mask can be higher than that of the photoelectrons emitted from the glass, which makes it possible to selectively observe the metal mask in the glass. Therefore, the electron microscope 1 is capable of inspecting the structure of the metal mask formed in the glass.

The electron microscope 1 is also capable of inspecting a metal wiring (such as Cu) in an insulating material (such as low-k). The metal wiring in the insulating material has a higher density of states at the Fermi level than the insulating material. Therefore, by setting STV and the energy slit 23 so as to allow electrons with energy near the Fermi level to pass, the detection intensity of the photoelectrons emitted from the metal wiring can be higher than that of the photoelectrons emitted from the insulating material, which makes it possible to selectively observe the metal wiring in the insulating material. Therefore, the electron microscope 1 is capable of inspecting the metal wiring in the insulating material.

REFERENCE SIGNS LIST

1: electron microscope
2: laser light source
7: CW laser
13: energy adjusting mechanism
14: power source
21: first electron lens system
22: energy analyzer
23: energy slit
24: second electron lens system
25: electron beam detector
27: electron beam

The invention claimed is:

1. An electron microscope, comprising:
a laser light source configured to generate a CW laser;
an irradiation lens system configured to irradiate a measurement sample with the CW laser;
an energy analyzer configured to disperse, depending on energy, photoelectrons emitted from the measurement sample by irradiation with the CW laser;
an energy slit configured to allow a photoelectron with a specified energy to pass, among the photoelectrons;
an electron beam detector configured to detect the photoelectron passed through the energy slit;
a first electron lens system configured to focus the photoelectrons emitted from the measurement sample onto the energy analyzer; and
a second electron lens system configured to project the photoelectron passed through the energy slit onto the electron beam detector.

2. The electron microscope according to claim 1, wherein a difference between an energy of the CW laser and a work function of the measurement sample is in a range of 0.0 eV to 0.5 eV.

3. The electron microscope according to claim 1, further comprising
an energy adjusting mechanism configured to apply a specified voltage to the measurement sample to adjust the energy of the photoelectrons.

4. The electron microscope according to claim 3, wherein the energy adjusting mechanism is configured to determine the specified voltage to be applied to the measurement sample, based on density of states of the measurement sample.

5. The electron microscope according to claim 1, further comprising
a power source configured to apply a voltage to facilitate emission of the photoelectrons from the measurement sample.

6. The electron microscope according to claim 5, wherein the power source is configured to charge the first electron lens system to a positive voltage to attract the photoelectrons from the measurement sample to the first electron lens system.

7. A method for observing a measurement sample, comprising:
irradiating the measurement sample with a CW laser generated by a laser light source;
using a first electron lens system to focus photoelectrons emitted from the measurement sample by irradiation with the CW laser onto an energy analyzer;
dispersing the photoelectrons depending on energy, using the energy analyzer;
irradiating an energy slit with the photoelectrons dispersed to select a photoelectron with a specified energy among the photoelectrons;
using a second electron lens system to project the photoelectron passed through the energy slit onto an electron beam detector; and
detecting the photoelectron projected onto the electron beam detector.

8. The method according to claim 7, further comprising using an energy adjusting mechanism to apply, to the measurement sample, a voltage that is determined based on density of states of the measurement sample.

9. The method according to claim 7, further comprising using a power source to apply a positive voltage to the first electron lens system, to attract the photoelectrons from the measurement sample to the first electron lens system.

* * * * *